United States Patent [19]

Seo

[11] Patent Number: 4,757,215

[45] Date of Patent: Jul. 12, 1988

[54] DATA TRANSMISSION CIRCUIT HAVING DECREASED PARASITIC CAPACITANCE

[75] Inventor: Seung-Mo Seo, Seoul, Rep. of Korea

[73] Assignee: Samsung Semiconductor & Telecommunications Co., Ltd., Gumi City, Rep. of Korea

[21] Appl. No.: 67,016

[22] Filed: Jun. 29, 1987

[30] Foreign Application Priority Data

Jun. 30, 1986 [KR] Rep. of Korea .................... 86-5286

[51] Int. Cl.[4] .................. H03K 19/096; H03K 17/16; H03K 17/687; H03K 17/56
[52] U.S. Cl. .................................. 307/452; 307/443; 307/582; 307/242
[58] Field of Search ............... 307/443, 452, 475, 530, 307/241, 242, 582; 328/103, 152

[56] References Cited

U.S. PATENT DOCUMENTS 4,429,374 1/1984 Tanimura ........................... 307/448

FOREIGN PATENT DOCUMENTS 0214787 3/1987 European Pat. Off. ............ 307/448

Primary Examiner—John S. Heyman
Assistant Examiner—M. R. Wambach
Attorney, Agent, or Firm—Robert E. Bushnell

[57] ABSTRACT

A data transmission circuit for CMOS dynamic random access memory devices having a data input buffer for converting TTL input data signals to CMOS logic level data signals and providing true and complement data signals on a pair of data bus lines, a pair of transmission gates for transmitting the true and complement data signals to a pair of true and complement I/O bus lines comprising a pair of similar constitutional I/O bus line pull-up or pull-down circuits between the output lines of the transmission gates and the I/O bus lines for making logic operations on the data bus lines. The I/O bus lines alternate at the time of a writing operation and a I/O bus line equalizing circuit is connected between the true and complement I/O bus lines for equalizing the pair of the I/O bus lines at a high speed, before or after a writing cycle.

25 Claims, 4 Drawing Sheets

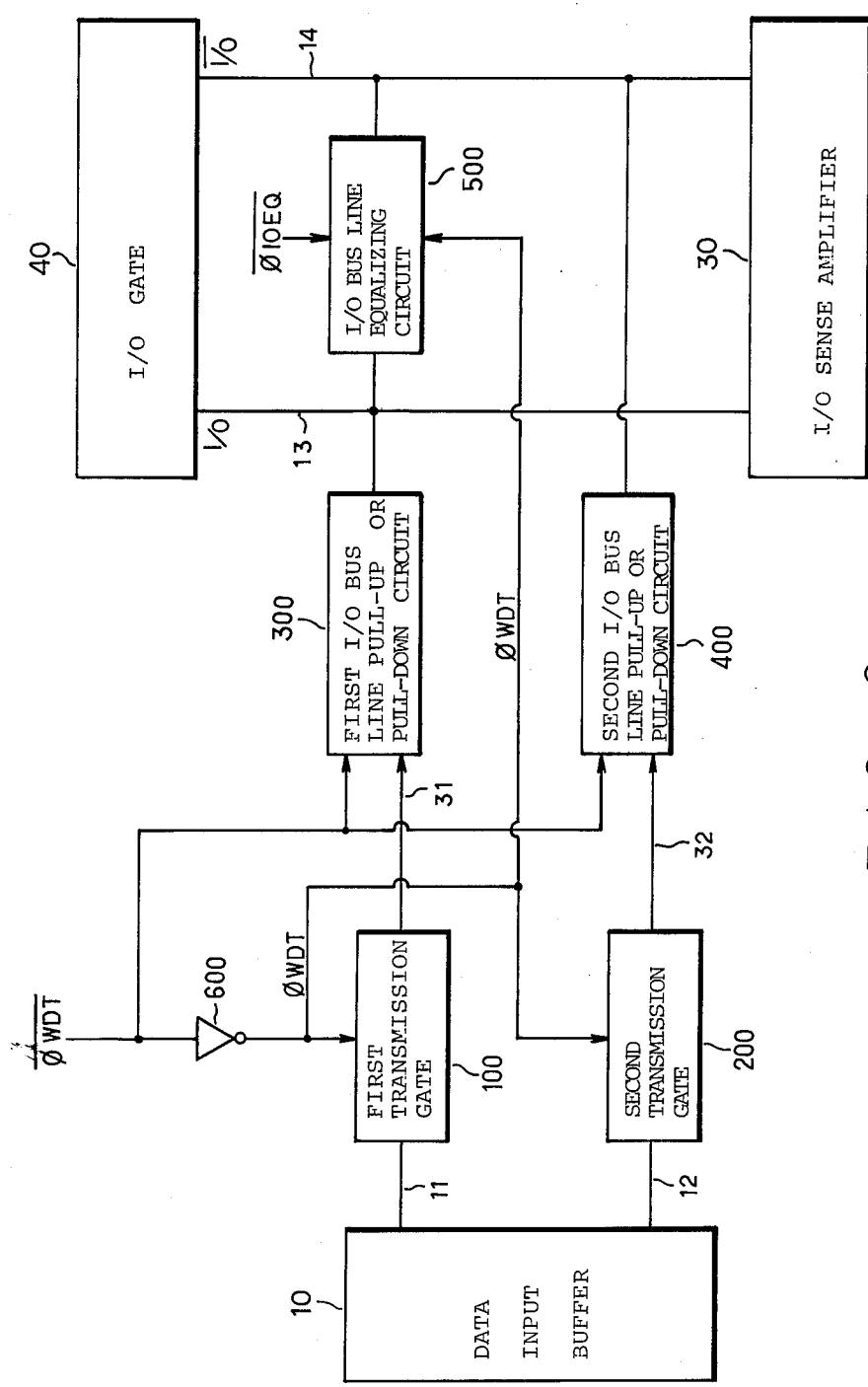
F I G. 2

4,757,215

DATA TRANSMISSION CIRCUIT HAVING DECREASED PARASITIC CAPACITANCE

BACKGROUND OF THE INVENTION

The present invention relates to a data transmission circuit for use in semiconductor memory devices, and more particularly relates to a data transmission circuit for transmitting data signals from a data input buffer to a pair of input/output (hereinafter will be referred to as an "I/O") bus lines in a CMOS dynamic random access memory (hereinafter will be referred to as a "DRAM") device.

Conventionally, a CMOS DRAM device includes the data input buffer which is activated in a write cycle and converts TTL (Transistor - Transistor Logic) level input data signals to CMOS logic level data signals. The data input buffer supplies true and complement output data signals on a pair of data bus lines, respectively, and signals on the pair of data bus lines are respectively sent to a pair of I/O bus lines. Thereafter, the true and complement signals on the I/O bus lines are respectively transmitted on a pair of corresponding bit lines via a pair of transfer gates respectively coupled to the I/O bus lines and turned on by a column address signal via a sense amplifier. One of the data signals on the bit line pair is written into one memory cell selected by a row address signal provided by a row address decoder.

However, since in high density DRAM devices, for example, in such devices as a 1 mega-bit DRAM, both the data bus line pair and the I/O bus lines pair extend a long distance from the data input buffer to the bit line pair in view of the circuit arrangement, the data input buffer must bear the burden of driving one of the data bus line pairs having parasitic capacitance of approximately 1.5 pf per line and the corresponding I/O bus line having about 3 pf to 4 pf per line as a load.

To assist in understanding the disadvantages which plague prior art devices, a data transmission circuit is shown in a block diagram form in FIG. 1. Referring to FIG. 1, the data signal read into the circuit through the data input buffer 10 is outputted as a pair of true and complement MOS logic level data signals DIN and $\overline{\text{DIN}}$, and the signals DIN and $\overline{\text{DIN}}$ are respectively coupled to a pair of data bus lines 11 and 12. The signals DIN and $\overline{\text{DIN}}$ are respectively sent on the I/O bus lines 13 and 14 through a pair of transmission transistors 1 and 2 which are turned on by the transfer gate control clock signal on a gate line 16 generated with the combination of a write enable signal and column address signals. The data signals transmitted on the I/O bus lines 13 and 14 are respectively sent on a pair of bit lines 61 and 60 through a pair of transmission transistors 44 and 43 constituting a transfer gate 40 turned on by the column address signal on a gate line 41 and through a sense amplifier 50. Thereafter, one of true and complement data signals on the bit lines 61 or 60 are written into a memory cell 63 or 62 by a row address signal on a row address line 65 or 64.

An I/O sense amplifier 30 works only in a read cycle amplifies one of true and complement data signals on the I/O bus lines 13 and 14 read out from the memory cells. An equalizer circuit 20 begins the operation for equalizing the I/O bus lines 13 and 14 at the precharge time of read and write cycle.

Therefore, the data transmission circuit shown in FIG. 1 must drive the large parasitic capacitance of the data bus line and its corresponding I/O bus line as a load in order to write data information into a memory cell 62 or 63. Thus, the data input buffer 10 must include a large size current drive transistor at the output stage thereof in order to charge the large parasitic capacitance and as a result, a low rate transfer speed and the large power consumption are effected.

One way of decreasing the parasitic capacitance of the I/O bus line providing the largest capacitance was to divide on chip all memory cells into several blocks including a certain number of memory cells according to the integration and density of memory cells. Such increase of the number of divided blocks causes an increase of I/O bus line pairs and that of their corresponding transmission transistors.

In a write cycle for reading the data information into the memory cell array, however many are the I/O bus line pairs due to the number of such divided blocks, there is no problem because only one of I/O bus line pairs is selected and then one of the data signals on the selected I/O bus line pair is stored in an addressed memory cell. However, the larger the integration density of memory cells, the more serious is the problem of testing the memory cells when the memory device is manufactured. That is, the test time for writing data information into all memory cells and for reading the sotred information out from each memory cell increases greatly according to the increased density of memory cells. Therefore, to achieve a high speed test of memory cells, a plurality of data bits must be written into addressed memory cells and read out from those memory cells. In this case, since the I/O bus line pairs must be coupled to the data input buffer in the same numbers as the number of data bits written into memory cells, the load burden of the data input buffer will be increased by the number of such data bits. Finally the size of the transistors for driving the I/O bus pairs at the output stage of the data input buffer will be increased to accommodate the increased parasitic capacitance and as a result, the chip size will be increased.

SUMMARY OF THE INVENTION

An object of the present invention is to provide an improved data transmission circuit; it is another object to provide a data transmission circuit which can effect a decreased load burden an a data input buffer at the time of a fast test in a write cycle.

These and other objects of the invention are achieved in a data transmission circuit for transmitting input data signals from a data input buffer having true and complement output terminals to a pair of true and complement input/output bus lines. The data transmission circuit includes a true and a complement data bus line connected to each of true and complement output terminals of said data input buffer;

a first and a second line connected to said data bus lines respectively;

a first and a second transmission gate connected between said true and complement data bus lines and said first and second lines respectively, said first and second transmission gates transferring the respective data signals on said true and complement data bus lines to said first and second lines in response to a first clock in a writing cycle;

first and second input/output bus line pull-up and pull-down means connected between said first and second lines and said complement and true input/output bus lines respectively, said means pulling both said first and second lines down except for a write cycle with the inversion clock of said first clock, and inverting the respective data signals on said first and second lines in response to said inversion clock in order to make respective logic operations on said data bus lines and said input/output bus lines alternate in the write cycle; and input/output bus line equalizing means connected between said true and complement input/output bus lines, said means equalizing both of said input/output bus lines together with said first clock and an input/output equalizing clock.

BRIEF DESCRIPTION OF THE DRAWINGS

FIG. 2 is a block diagram of a preferred embodiment of the invention,

DETAILED DESCRIPTION OF THE INVENTION

Figure 1:
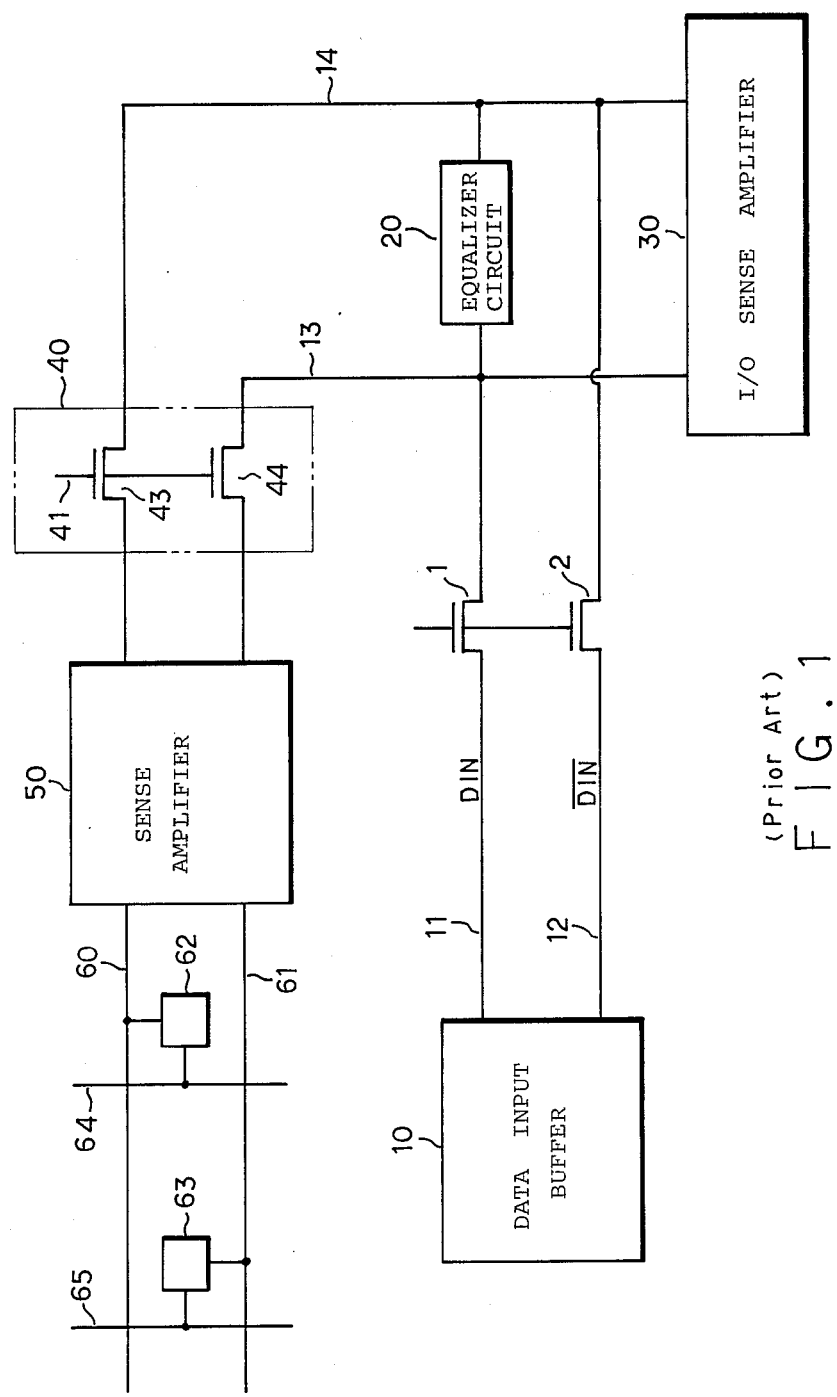
FIG. 1 is a block diagram of a conventional data transmission circuit.

FIG. 2 is a block diagram of a data transmission circuit according to the present invention. Referring to FIG. 2, the reference numerals of a data input buffer, a pair of data bus lines, a pair of I/O bus lines, an I/O gate and an I/O sense amplifier are used to designate like elements or parts to those in the conventional circuit of FIG. 1.

The present invention of FIG. 2 includes a first transmission gate 100 which is coupled to the data bus line 11 connected to a complement output line of the data input buffer 10 and is turned on or off by the input of the complement clock $\phi$ WDT of the write data transmission clock $\overline{\phi \text{ WDT}}$ generated by the combination of a write enable signal and address signals, a second transmission gate 200 which is coupled to the other data bus line 12 having the complementary signal in connection with the data signal on the data bus line 11 and is turned on or off by said pulse $\phi$ WDT, a first I/O bus line pull-up or pull-down circuit 300 which is coupled to an output line 31 of the first transmission gate 100 and does the pull-up or pull-down work under the control of clock $\phi$ WDT, a second I/O bus line pull-up or pull-down circuit 400 which is coupled to an output line 32 of the second transmission gate 200 and does the contrary pull up or pull down work in comparison with the work of said first I/O bus line pull-up or pull-down circuit 300 under the control of clock $\overline{\phi \text{ WDT}}$, and an I/O bus line equalizing circuit 500 which is connected between an I/O bus line 13 coupled to the output line of the first I/O bus line pull-up or pull-down circuit and an $\overline{\text{I/O}}$ bus line 14 coupled to the output line of the second I/O bus line pull-up or pull-down circuit, and causes equalization of both lines 13 and 14 with an equalizing clock $\overline{\phi \text{ IOEQ}}$ and pulls down both the lines 13 and 14 with clock $\phi$ WDT.

Prior to the output of data from the data input buffer 10, the first and second I/O bus line pull-up and pull-down circuits 300 and 400 delivered the clock $\overline{\phi \text{ WDT}}$ which makes lines 31 and 32 pull-down to low state and at the same time the I/O bus line equalizing circuit 500 delivered the clock $\phi$ WDT which causes I/O bus lines 13 and 14 to pull up at a high state (VDD).

Now, if the data signals from the data input buffer 10 are supplied on the data bus lines 11 and 12, both first and second transmission gate 100 and 200 are activated by the clock $\phi$ WDT and then delivers data signals on the data bus lines to lines 31 and 32, respectively. Thereafter Pata signals on the lines 31 and 32 are inverted by the first and second I/O bus line pull-up and pull-down circuits 300 and 400 under the control of the clock $\phi$ $\overline{\text{WDT}}$ and are delivered to I/O bus lines 13 and 14, respectively. Therefore, if the data signal on line 31 is at a logic high state, the I/O bus line 13 corresponding to the line 31 of logic high state will remain at a low state. This state is fed back in the I/O bus line pull-up and pull-down circuits 300 and the line 31 of logic high state is pulled up into a high state in order not to lose the inherent data signal of the line 31. Moreover, the first and second I/O bus line pull-up and pull-down circuit 300 and 400 respectively work to completely isolate data bus lines 11 and 12 and I/O bus lines 13 and 14 with the control pulse $\phi$ $\overline{\text{WDT}}$.

Subsequent to writing the data signal on the I/O bus line 13 or 14 into the memory array through the I/O gate 40, the I/O bus line equalizing pulse $\phi$ IOEQ is supplied to the I/O bus line equalizing circuit 500 and both I/O bus lines 13 and 14 are then precharged to a logic high state.

Figure 3:
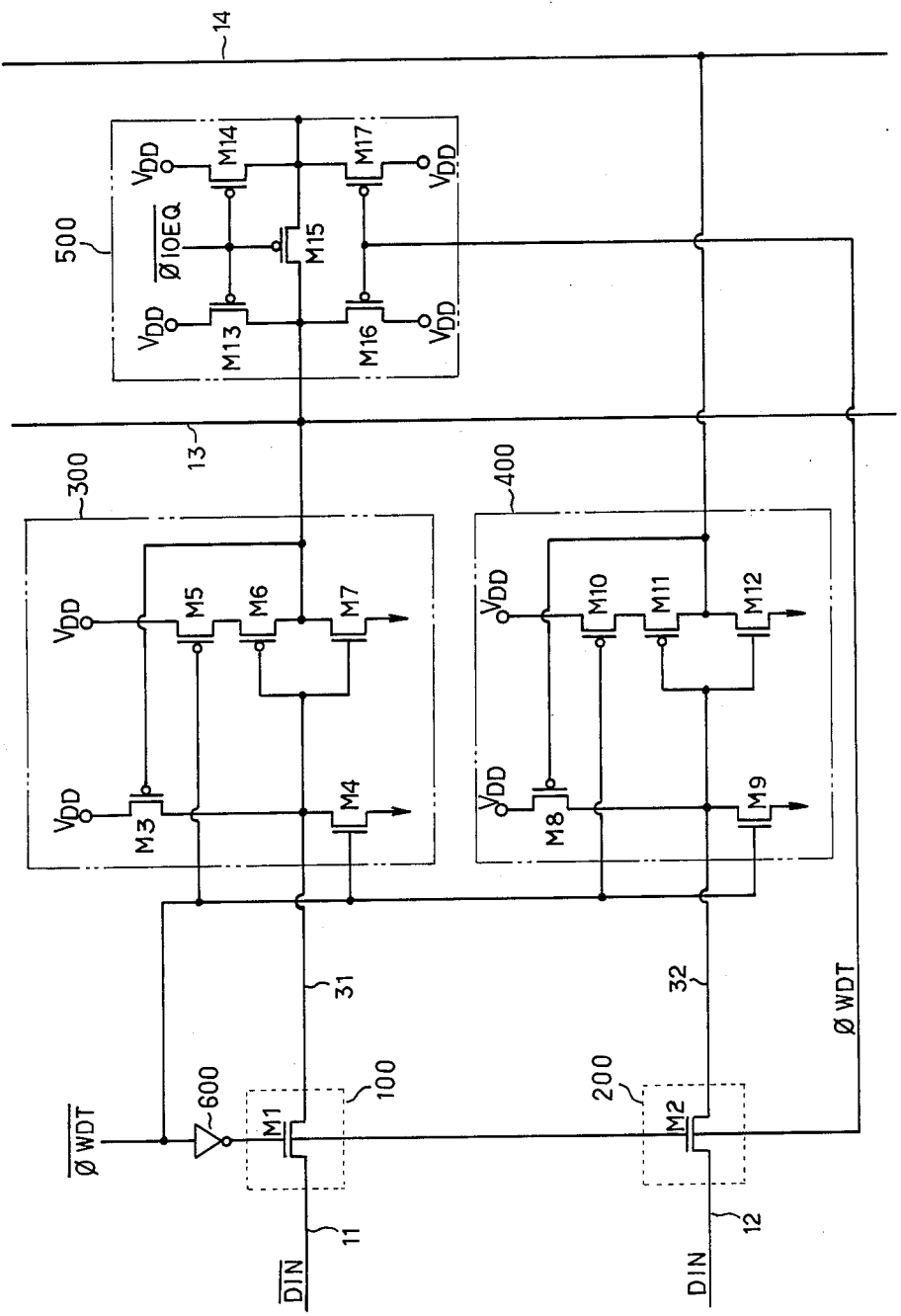
FIG. 3 is a circuit diagram showing a portion of the block diagram of FIG. 2.

Referring to FIG. 3 showing a circuit diagram of a portion of FIG. 2, data bus lines 11 and 12 are connected to the output line of the data input buffer 10 and I/O bus lines 13 and 14 are connected to the I/O gate 40.

Transistors M1, M2, M4, M7, M9 and M12 are N-channel MOS transistors and Transistors M3, M5, M6, M8, M10, M11 and M13 through M17 are P-channel MOS transistors. VDD depicts a power supply source voltage and remaining reference numerals are used to designate like elements or parts to those in FIG. 2.

Figure 4:
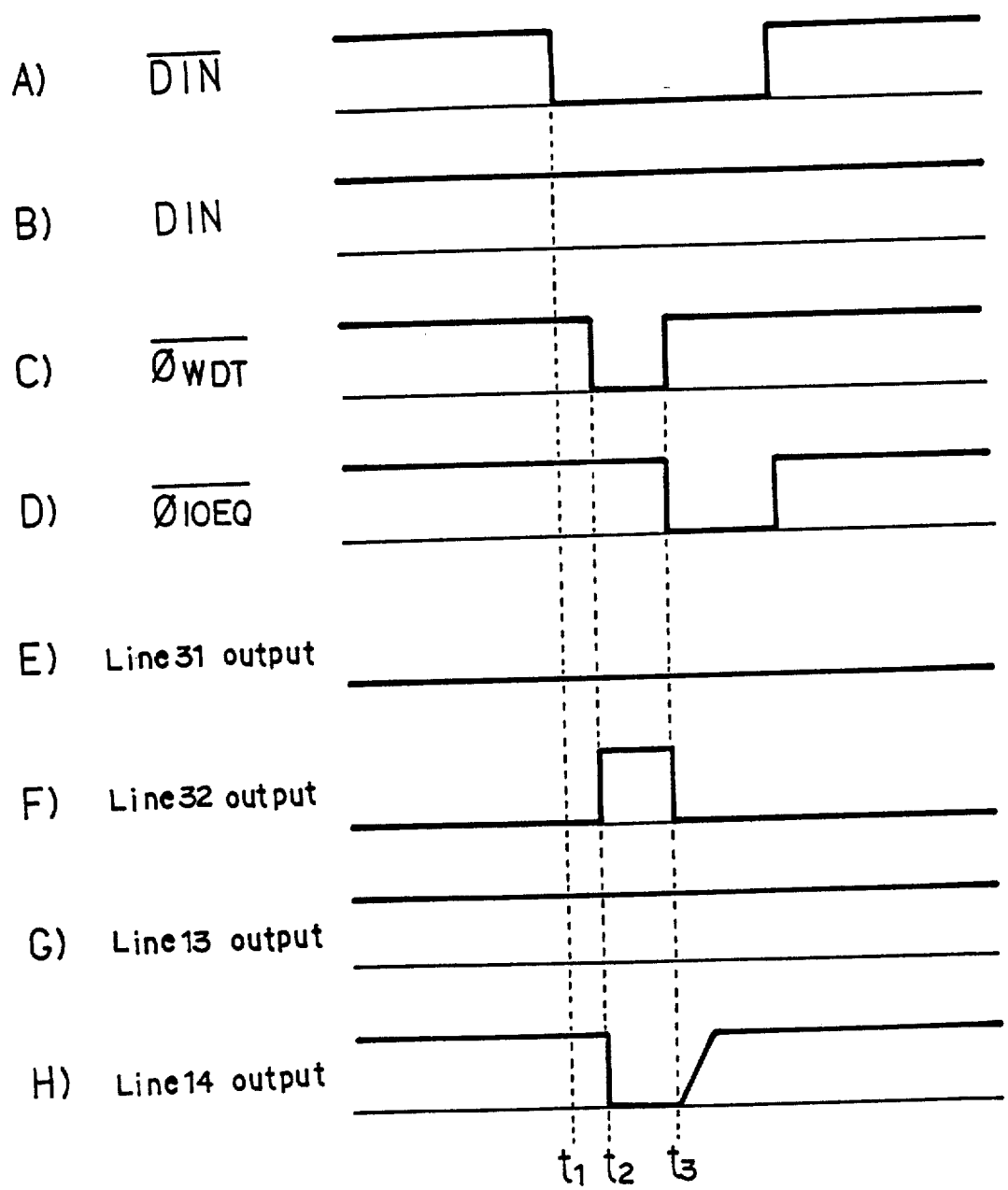
FIG. 4 is a waveform diagram illustrative of the operation of the circuit FIG. 3.

Referring FIG. 4, FIG. 4(A) and FIG. 4(B) are respectively waveform diagrams of data signal $\overline{\text{DIN}}$ and DIN on data bus lines 11 and 12 provided by data input buffer 10. FIG. 4(C) and FIG. 4(D) represent timing diagrams of the write data transmission clock $\overline{\phi \text{ WDT}}$ and the I/O bus line equalizing clock $\overline{\phi \text{ IOEQ}}$ respectively. FIG. 4 (E) and FIG. 4(F) represent output waveforms of first and second transmission gates 100 and 200 respectively. Finally, FIG. 4(G) and FIG. 4(H) represent output waveforms of I/O bus lines 13 and 14 respectively.

Hereinafter, the operation of the invention of FIG. 3 will be described in detail in connection with waveform diagrams of FIG. 4.

Before data signals $\overline{\text{DIN}}$ and DIN on data bus lines 11 and 12 are supplied (prior to the time t1 of FIG. 4), both the write data transmission clock $\overline{\phi \text{ WDT}}$ and the I/O bus line equalizing clock $\overline{\phi \text{ IOEQ}}$ are maintained at logic high states. Therefore, pull-down transistors M4 and M9 respectively constituting first and second I/O bus line pull-up and pull-down circuits 300 and 400 are turned on and both the line 31 and the line 32 become low. Also, pull-up transistors M16 and M17 constituting the I/O bus line equalizing circuit 500 are turned on by the inverted clock $\phi$ WDT through an inverter 600, thereby both the I/O bus line 13 and 14 are precharged to logic high states.

Assuming that the true data signal DIN and the complement data signal $\overline{\text{DIN}}$ were respectively applied on data bus lines 12 and 11 as shown in FIG. 4(A) and FIG. 4(B) following the time t1 and the pulse $\phi$ WDT became low at the time t2 as illustrated in FIG. 4(C), transistors M1 and M2 respectively constituting first and second transmission gates 100 and 200 would be turned on by the inverted clock of the pulse φ WDT through the inverter 600 and then signals on lines 31 and 32 would become low and high respectively. These data signals on lines 31 and 32 are respectively supplied to the gates of transistors M6 and M7 and to the gates of transistors M11 and M12. At the same time, the clock φ WDT is applied to the gates of transistors M5 and M10 with the logic low state. Therefore, transistors M5 and M6 are turned on by the low state signal of the clock φ WDT and by the low state signal on the line 31 while the transistor M11 is turned off and the transistor M12 is turned on by the high state signal on the line 32.

Thereafter, the I/O bus line 13 remains at the logic high level state (VDD volts), while the I/O bus line 14 is discharged to the logical low level state (the ground level state) through the drain-source path of the transistor M12.

On the other hand, the high state signal on the I/O bus line 13 and the low state signal on the I/O bus line 14 are respectively fed back to the gates of transistors M3 and M8 and then the transistor M3 is turned off and transistor M8 is turned on. Therefore, the signal state on the line 31 maintains a logic low level state, while the signal on the line 32 becomes full VDD through the drain-source path of the transistor M8.

As a result, I/O bus lines 13 and 14 respectively succeed to remain at the logic high state and the logic low state. These true and complement data signals on I/O bus lines 13 and 14 are supplied to the memory array through the I/O gate 40 of FIG. 2.

Thereafter, at time t3, transistors M13, M14 and M15 are turned on by the state of the I/O bus line equalizing clock φ IOEQ and then both I/O bus lines 13 and 14 are charged to the power supply source voltage VDD. At the same time, since the high state of the clock φ WDT is applied to gates of transistors M16 and M17 through the inverter 600, both transistors M16 and M17 are turned on and then both I/O bus lines 13 and 14 are completely charged to the logic high level states through the source-drain paths of transistors M16 and M17.

As described above, the decreased size of the load transistors of the data input buffer will be achieved because the data input buffer treats only the parasitic capacitance of data bus lines as a load with the circuit arrangement of the I/O bus line pull-up and pull-down circuit between the transmission gate and the I/O bus line. Moreover, a size of the transmission transistor can be designed by an order of 1/5 lower than a conventional transmission gate because of the current flow charging only the parasitic capacitance of the line between the transmission gate and the I/O bus line pull-up and pull-down circuit.

I claim:

1. In an integrated circuit for CMOS dynamic random access memory devices, a data transmission circuit for transmitting input data signals from a data input buffer having true and complement output terminals to a pair of true and complement input/output bus lines, comprising:
    true and complement data bus lines respectively connected to corresponding ones of true and complement output terminals of said data input buffer;
    first and second lines respectively connected to different ones of said data bus lines;
    first and second transmission gates connected between respective ones of said true and complement data bus lines and said first and second lines, said first and second transmission gates respectively transferring the data signals on said true and complement data bus lines to said first and second lines in response to a first clock signal in a write cycle;
    first and second input/output bus line pull-up and pull-down means connected between respective ones of said first and second lines and a complement and true input/output bus lines, said bus line pull-up and pull-down means for pulling both said first and second lines down with an inversion clock signal of said first clock signal except during a write cycle and for inverting the respective data signals on said first and second lines in response to said inversion clock signal to make respective logic operations on said data bus lines and the input/output bus lines alternate during the write cycle; and
    input/output bus line equalizing means connected between the true and complement input/output bus lines, said equalizing means for equalizing both of said input/output bus lines with said first clock signal and an input/output equalizing clock signal.

2. The data transmission circuit of claim 1, wherein each of said first and second input/output bus line pull-up and pull-down means includes:
    a first N-channel MOS transistor having a gate coupled to receive said inversion clock signal and a drain and a source connected between a corresponding one of said first and second lines and a reference potential,
    a second N-channel MOS transistor having a source connected to the reference potential, a gate connected to a corresponding one of said first or second lines and a drain connected to a corresponding one of the true and complement input/output bus lines,
    a first P-channel MOS transistor having a drain connected to a corresponding one of the true and complement input/output bus lines, a gate connected to a corresponding one of said first and second lines and a source connected to a drain of another P-channel MOS transistor gate connectable to receive said inversion clock signal and a source is connectable to a supply source voltage, and
    a second P-channel MOS transistor having a gate connected to a corresponding one of said true and complement input/output bus lines, a drain connected to a corresponding one of said first second lines and a source connectable to the supply source voltage.

3. The data transmission circuit of claim 1, wherein said input/output bus line equalizing means includes:
    a P-channel MOS transistor having a drain-source path connected between the true and complement input/output bus lines and a gate coupled to receive said equalizing clock signal.
    a first pair of P-channel MOS transistors having drains connected to different ones of said true and complement input/output bus lines, sources connectable to the supply source voltage and gates coupled to receive and equalizing clock signal, and
    a second pair of P-channel MOS transistors having drains connected to different ones of said true and complement input/output bus lines, sources connectable to the supply source voltage and gates coupled to receive said first clock signal.

4. The data bus transmission circuit of claim 2, wherein said input/output bus lines equalizing means includes:
 a P-channel MOS transistor having a drain-source path connected between the true and complement input/output bus lines and a gate coupled to receive said equalizing clock signal;
 a first pair of P-channel MOS transistors having drains connected to different ones of said true and complement input/output bus lines, sources connectable to receive the supply source voltage and gates coupled to receive said equalizing clock signal; and
 a second pair of P-channel MOS transistors having drains connected to different ones of said true and complement input/output bus lines, sources connectable to the supply source voltage and gates coupled to receive said first clock signal.

5. The data transmission circuit of claim 1, wherein each of said first and second transmission gates comprises a transistor having a gate coupled to receive said first clock signal and a drain-source path connected between one of said data bus lines and a corresponding one of said first and second lines.

6. The data transmission circuit of claim 2, wherein each of said first and second transmission gates comprises a transistor having a gate coupled to receive said first clock signal and a drain-source path connected between one of said data bus lines and said gates of corresponding ones of said second N-channel MOS transistors and first P-channel MOS transistors.

7. The data transmission circuit of claim 1, wherein said input/output bus line equalizing means further comprises means for maintaining both of the true and complement input/output buses at the same logic level except during the interval between said first clock signal and said input/output equalizing clock signal.

8. The data transmission circuit of claim 7, wherein said maintaining means comprises first and second MOS transistors each having gates coupled to respond to said first clock signal, and drain-source paths connectable between different ones of the true and complement input/output buses and a supply source voltage.

9. The data transmission circuit of claim 2, wherein said input/output bus line equalizing means further comprises means for maintaining both of the input/output buses at the same logic level and for interrupting maintenance of said same logic level during the interval between said first and second clock signals.

10. The data transmission circuit of claim 9, wherein said maintaining means comprises first and second MOS transistors each having gates coupled to respond to said first clock signal, and drain-source paths connectable between different ones of the true and complement input/output buses and a supply source voltage.

11. A data transmission circuit, comprising:
 true and complement data buses for receiving input data signals from respective ones of true and complement and complement output terminals;
 first transmission gating means for transferring input data signals via said true data bus;
 second transmission gating means for transferring input data signals via said complement data bus;
 inverting means coupled between said first gating means and a true input/output bus, and between said second gating means and a complement input/output bus for receiving said input data signals via said first and second gating means, and for inverting logic levels of input data signals received via said first and second gating means to provide output data signals to the true and complement input/output buses, respectively; and
 equalizing means coupled between the true and complement input/output buses for equalizing both of said input/output buses to the same logic level in response to reception of a second clock signal.

12. The data transmission circuit of claim 11, wherein said equalizing means further comprises means for maintaining both of the input/output buses at the same logic level except during the interval between said first and second clock signals.

13. The data transmission circuit of claim 11, wherein said inverting means comprises first and second inverting circuits each comprising:
 a first MOS transistor having a gate connectable to receive an inversion clock signal of said first clock signal and drain and a source connected between a corresponding one of said first gating means and said second gating means and a reference potential;
 a second MOS transistor having a source connected to the reference potential, a gate connected to a corresponding one of said first and second gating means and a drain connected to a corresponding one of the true and complement input/output buses;
 a third MOS transistor having a gate connectable to receive said inversion clock signal and a source connectable to a supply source voltage;
 a fourth MOS transistor having a drain connected to a corresponding one of the true and complement input/output buses, a gate connected to a corresponding one of said first and second gating means and a source connected to a drain of said third MOS transistor; and
 a fifth MOS transistor having a gate connected to a corresponding one of the true and complement input/output buses, a drain connected to a corresponding one of said first and second gating means, and a source connectable to the supply source voltage.

14. The data transmission circuit of claim 11, wherein said equalizing means comprises:
 an MOS transistor having a drain-source path connected between the true and complement input/output buses, and a gate coupled to receive said second clock signal;
 a first pair of MOS transistors having drains connected to different ones of said true and complement input/output buses, sources connectable to the supply source voltage, and gates coupled to receive the second clock signal; and
 a second pair of MOS transistors having drains connected to different one of said true and complement input/output buses, sources connectable to the supply source voltage, and gates coupled to receive first clock signal.

15. The data transmission circuit of claim 13, wherein said equalizing means comprises:
 a sixth MOS transistor having a drain-source path connected between the true and complement input/output buses, and a gate coupled to receive said second clock signal;
 a first pair of MOS transistors having drains connected to different ones of said true and complement input/output buses, sources connectable to the supply source voltage, and gates coupled to receive the second clock signal; and a second pair of MOS transistors having drains connected to different ones of said true and complement input/output buses, sources connectable to the supply source voltage, and gates coupled to receive said first clock signal.

16. The data transmission circuit of claim 11, wherein each of said first and second gating means comprises a transistor having a gate coupled to receive said first clock signal and a drain-source path connected between one of said data bus lines and said inverting means.

17. The data transmission circuit of claim 13, wherein each of said first and second gating means comprises a transistor having a gate coupled to receive said first clock signal and a drain-source path connected between one of said data bus lines and the gates of corresponding ones of said second and fourth MOS transistors.

18. The data transmission circuit of claim 13, wherein said input/output bus lines equalizing means further comprises means for maintaining both of the input/output buses at the same logic level and for interrupting maintenance of said same logic level during the interval between said first and second clock signals.

19. The data transmission circuit of claim 18, wherein said maintaining means comprises sixth and seventh MOS transistors each having gates coupled to respond to said first clock signal, and drain-source paths connectable between different ones of the true and complement input/output buses and a supply source voltage.

20. An integrated CMOS data transmission circuit, comprising:

true and complement data buses for receiving input data signals from respective ones of true and complement output terminals;

first transmission gating means for transferring input data signals during a write cycle via said true data bus in response to a first clock signal;

second transmission gating means for transferring input data signals during said write cycle via said complement data bus in response to said first clock signal;

inverting means coupled between said first gating means and a true input/output bus, and between said second gating means and a complement input/output bus, for receiving said input data signals via said first and second gating means during said write cycle and for inverting logic levels of input data signals received via said first and second gating means to provide output data signals to said true and complement input/output buses, respectively; and equalizing means coupled between the true and complement input/output buses for equalizing both of the input/output buses to the same logic level in response to a second clock signal, for maintaining both of the intput/output buses at the same logic level, and for interrupting maintenance of said same logic level during the interval between said first and second clock signals.

21. The data transmission circuit of claim 20, wherein said inverting means comprises first and second inverting circuits each comprising:

a first P-channel MOS transistor having a gate connectable to receive an inversion clock signal of said first clock signal and a drain and a source connected between a corresponding one of said first gating means and said second gating means and a reference potential;

a second N-channel MOS transistor having a source connected to the reference potential, a gate connected to a corresponding one of said first and second gating means and a drain connected to a corresponding one of the true and complement input/output buses;

a first P-channel MOS transistor having a gate connectable to receive said inversion clock signal and a source connectable to a supply source voltage;

a second P-channel MOS transistor having a drain connected to a corresponding one of the true and complement input/output buses, a gate connected to a corresponding one of said first and second gating means and a source connected to a drain of said first P-channel MOS transistor; and a third P-channel MOS transistor having a gate connected to a corresponding one of the true and complement input/output buses, a drain connected to a corresponding one of said first and second gating means, and a source connectable to the supply source voltage.

22. The data transmission circuit of claim 20, wherein said equalizing means comprises:

a P-channel MOS transistor having a drain-source path connected between the true and complement input/output buses, and a gate coupled to receive said second clock signal;

a first pair of P-channel MOS transistors having drains connected to different ones of said true and complement input/output buses, sources connectable to the supply source voltage, and gates coupled to receive the second clock signal; and a second pair of P-channel MOS transistors having drains connected to different ones of said true and complement input/output buses, sources connectable to the supply source voltage, and gates coupled to receive said first clock signal.

23. The data transmission circuit of claim 21, wherein said equalizing means comprises:

a fourth P-channel MOS transistor having a drain-source path connected between the true and complement input/output buses, and a gate coupled to receive said second clock signal;

a first pair of P-channel MOS transistors having drains connected to different ones of said true and complement input/output buses, sources connectable to the supply source voltage, and gates coupled to receive the second clock signal; and a second pair of P-channel MOS transistors having drains connected to different ones of said true and complement input/output buses, sources connectable to the supply source voltage, and gates coupled to receive said first clock signal.

24. The data transmission circuit of claim 20, wherein each of said first and second gating means comprises a transistor having a gate coupled to receive said first clock signal and a drain-source path conncted between one of said data bus lines and said inverting means.

25. The data transmission circuit of claim 21, wherein each of said first and second gating means comprises a transistor having a gate coupled to receive said first clock signal and a drain-source path connected between one of said data bus lines and the gates of corresponding ones of said second N-channel MOS and second P-channel MOS transistors.

* * * * *

UNITED STATES PATENT AND TRADEMARK OFFICE
CERTIFICATE OF CORRECTION

PATENT NO.  : 4,757,215

DATED       : 12 July 1988

INVENTOR(S) : Seung-Mo Seo

Page 1 of 2

It is certified that error appears in the above-identified patent and that said Letters Patent is hereby corrected as shown below:

Figure 4 of the drawings attached hereto is added.

Signed and Sealed this

Fourteenth Day of February, 1989

Attest:

DONALD J. QUIGG

*Attesting Officer*

*Commissioner of Patents and Trademarks*